(12) United States Patent
Becker et al.

(10) Patent No.: US 9,110,097 B2
(45) Date of Patent: Aug. 18, 2015

(54) TEST SYSTEM

(71) Applicant: Micronas GmbH, Freiburg (DE)

(72) Inventors: Sebastian Becker, Oberrimsingen (DE); Werner Kutscher, Neuenburg (DE)

(73) Assignee: Micronas GmbH, Freiburg (DE)

( * ) Notice: Subject to any disclaimer, the term of this patent is extended or adjusted under 35 U.S.C. 154(b) by 142 days.

(21) Appl. No.: 13/897,878

(22) Filed: May 20, 2013

(65) Prior Publication Data

US 2013/0307573 A1    Nov. 21, 2013

(30) Foreign Application Priority Data

May 18, 2012   (DE) .......................... 10 2012 009 796

(51) Int. Cl.
  *G01R 31/00*   (2006.01)
  *G01R 1/04*   (2006.01)
  *G01R 31/28*   (2006.01)

(52) U.S. Cl.
  CPC .......... *G01R 1/0483* (2013.01); *G01R 31/2865* (2013.01)

(58) Field of Classification Search
  CPC .......................... G01R 1/0483; G01R 31/2865
  USPC .............. 324/500, 756.01–758.01, 760, 537, 324/765; 257/48; 438/64, 330, 331, 59–62
  See application file for complete search history.

(56) References Cited

U.S. PATENT DOCUMENTS

| | | | |
|---|---|---|---|
| 5,172,049 A | 12/1992 | Kiyokawa et al. | |
| 6,078,185 A | 6/2000 | Tanaka et al. | |
| 6,335,629 B1 | 1/2002 | Lee et al. | |
| 6,732,127 B2 | 5/2004 | Karp | |
| 8,044,673 B1 * | 10/2011 | Burgyan | 324/750.16 |
| 2002/0054813 A1 * | 5/2002 | Davidov et al. | 414/788.1 |
| 2003/0117162 A1 | 6/2003 | Watts | |
| 2005/0090915 A1 * | 4/2005 | Geiwitz | 700/90 |
| 2005/0225346 A1 | 10/2005 | Saito et al. | |
| 2007/0159207 A1 * | 7/2007 | Brinz et al. | 324/766 |
| 2010/0052721 A1 | 3/2010 | Chang | |
| 2010/0108205 A1 | 5/2010 | Schaule et al. | |

FOREIGN PATENT DOCUMENTS

| | | |
|---|---|---|
| DE | 10 2006 015 365 A1 | 10/2007 |
| DE | 60 2004 008 562 T2 | 5/2008 |
| GB | 2 325 358 A | 11/1998 |
| GB | 2 401 432 B | 11/2004 |
| JP | 2002-164136 A | 6/2002 |

* cited by examiner

*Primary Examiner* — Melissa Koval
*Assistant Examiner* — Trung Nguyen
(74) *Attorney, Agent, or Firm* — Muncy, Geissler, Olds & Lowe, P.C.

(57) ABSTRACT

A test system having a manipulation device and a test unit. The manipulation device has a receiving unit with a socket that accommodates a packaged integrated circuit, which has a top side and a bottom side. A plurality of electrical terminal contacts are formed on the bottom side. In a first state, the manipulation device provides the integrated circuit to the test unit, and during the first state the test unit is disposed above the top side of the integrated circuit and forms a connection with the manipulation device, and the test unit carries out a function test on the integrated circuit. A sensor device is formed on the top side, and the top side of the integrated circuit is oriented in a direction of the test unit and the electrical terminal contacts are electrically connected to the receiving unit of the manipulation device.

17 Claims, 1 Drawing Sheet

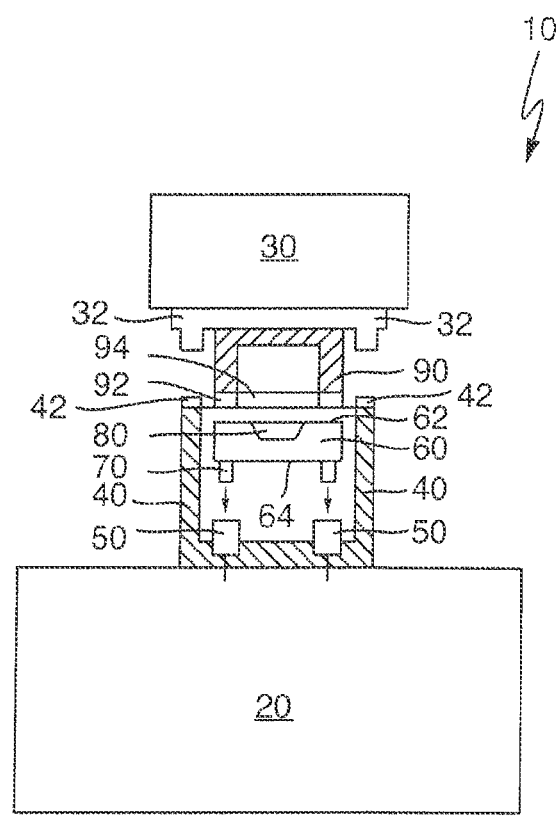

TEST SYSTEM

This nonprovisional application claims priority under 35 U.S.C. §119(a) to German Patent Application No. DE 10 2012 009 796.4, which was filed in Germany on May 18, 2012, and which is herein incorporated by reference.

BACKGROUND OF THE INVENTION

1. Field of the Invention

The present invention relates to a test system.

2. Description of the Background Art

U.S. Pat. No. 6,732,127 discloses a test system with a manipulation device, whereby the manipulation device is also called a handler and a test unit with a test head is known. With the use of the test system, a packaged integrated circuit, which has a top side and a bottom side and a plurality of electrical terminal contacts being formed on the bottom side, is inserted with the bottom side downward in a suitable socket in the manipulation device. The terminal contacts now point in the direction toward the test unit. During a measurement cycle, the terminal contacts are contacted directly by the test unit and the electrical parameters of the circuit are measured.

SUMMARY OF THE INVENTION

It is therefore an object of the present invention to provide a device that refines the state of the art.

According to an embodiment of the invention, a test system having a manipulation device and a test unit is provided, whereby the manipulation device has a receiving unit with a socket and the socket accommodates a packaged integrated circuit, and the packaged integrated circuit has a top side and a bottom side, and a plurality of electrical terminal contacts are formed on the bottom side, and there is an electrical connection between the socket and the terminal contacts, and in a first state by means of the receiving unit, the manipulation device provides the integrated circuit to the test unit, and whereby during the first state the test unit is disposed above the top side of the integrated circuit and forms a connection with the manipulation device, and the test unit carries out a function test on the integrated circuit, whereby a sensor device is formed on the top side, and the top side of the integrated circuit is oriented in the direction of the test unit and the electrical terminal contacts are electrically connected to the receiving unit of the manipulation device. It should be noted that the integrated circuit (IC) provided with packaging is inserted in the socket by means of the manipulation device, which is also called a handler, and after the insertion the circuit is electrically connected with the test unit. Such test systems are used particularly for the final measurement of semiconductor circuits after molding and are called testers. It should be noted, furthermore, that depending on the design type of the socket, different IC package shapes such as, for example, QFN-, QFP-, DIP-, or SOT-packaged ICs can be measured.

An advantage of the test system is that in the case of integrated circuits a sensor device disposed on the package surface can be tested in a simple and reliable manner. An expensive modification of the handler with the mounting of a special manipulation device adapted to the particular handler system, which contains a testing device for the sensor arrangement, is not necessary. In contrast to the prior-art solution, now the packaged integrated circuits, i.e., the ICs, are transported upside down into the handler. This type of implementation is also called "flipped" or "dead bug." The testing device for the sensor device, which is configured, for example, as a gas chamber for testing the functions of a gas sensor or moisture sensor, can be connected preferably gas-tight directly with the test unit.

In an embodiment, the receiving unit has a coupling device, whereby the socket, which accepts the integrated circuit, is electrically connected with the test unit by means of the coupling device. According to a further embodiment, the test unit has a receiving device for the coupling device, whereby the receiving device creates an electrical connection between the test unit and the coupling device. It is advantageous that the manipulation device, i.e., the handler, need not be equipped with measurement cards, disposed in the test unit, because the socket is connected electrically with the test unit via the coupling device and via the receiving device. A further advantage is that the receiving device and coupling device, which in the first state for measuring or testing preferably have a force-fitting and form-fitting connection in addition to the electrical connection, can be mounted simply and rapidly both on the handler and also the test unit. Tests have shown that customary testers, i.e., standard equipment, are readily suitable for retrofitting, i.e., installation of the coupling device and receiving device.

According to another embodiment, the integrated circuit has an opening on the top side in the package, whereby the sensor device is arranged preferably in part but at most preferably solely in the opening. In a preferred embodiment, the integrated circuit has a light sensor formed in the opening. In another embodiment, the sensor device comprises a gas sensor and/or a moisture sensor in addition or alternatively to the light sensor.

In another embodiment, the test unit has a gas chamber, whereby during the first state the gas chamber is connected gas-tight with the surface of the integrated circuit. Preferably, the gas chamber, which also has a formation made as an opening, completely covers the opening on the top side of the package. Tests have shown that it is advantageous to form an elastic sealing lip between the gas chamber and the surface of the integrated circuit. An advantage of the elastic sealing lip is that in a simple manner a gas-tight connection between the gas chamber and the opening on the top side can be achieved and damage during the flange mounting of the gas chamber on the top side of the packaging is prevented.

It should be noted further that the gas chamber has suitable supply and/or feed connections. By this means, according to another embodiment in the first state a predetermined gas concentration and/or moisture concentration can be formed within the gas chamber.

It turned out that the test system can be used for measuring electrical parameters of electric circuits, preferably as a function of the gas composition within the gas chamber. In this way, without conversion apart from the electrical function of an integrated circuit the function of the integrated sensor device can be tested in the test system. It is understood that the test unit is mechanically connected with the handler for the measuring or testing of the integrated circuit in a first state. After the testing or measuring of the integrated circuit during the first state, in a second state the handler moves away from the test unit and removes the measured circuit from the socket in order to insert another circuit in the socket.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWING

The present invention will become more fully understood from the detailed description given hereinbelow and the accompanying drawing which are given by way of illustration only, and thus, is not limitive of the present invention, and wherein the sole FIGURE illustrates a schematic cross-sectional view of a test unit according to an embodiment of the invention.

DETAILED DESCRIPTION

The single FIGURE shows a test system 10 with a manipulation device 20 and a test unit 30. For the sake of clarity, some of the components of test system 10 are shown in an unassembled state. Manipulation device 20, also called a handler, has a receiving unit 40 with a socket 50, whereby socket 50 accommodates a packaged integrated circuit 60. Receiving unit 40 is electrically connected with socket 50. In the packaged integrated circuit 60, which has a top side 62 and a bottom side 64, a plurality of electrical terminal contacts 70 are formed on bottom side 64. If integrated circuit 60 is inserted, there is an electrical connection between socket 50 and terminal contacts 70. Manipulation device 20 by means of receiving unit 40 in a first state provides integrated circuit 60 to test unit 30. In this scenario, in the first state, test unit 30 is arranged above top side 62 of integrated circuit 60 and with manipulation device 20 forms a mechanical, i.e., force-fitting and form-fitting connection, so that a function test can be performed by means of test unit 30 on integrated circuit 60 and the sensor device. A sensor device is formed on top side 62 of integrated circuit 60, whereby top side 62 of integrated circuit 60 is oriented in the direction of test unit 30 and the electrical terminal contacts 70 are electrically connected with receiving unit 40 of manipulation device 20. By means of receiving unit 40, the handler is electrically connected with a coupling device 42 and mechanically with test unit 30. For coupling with coupling device 42, test unit 30 has a specially formed receiving device 32. An electrical connection is produced between test unit 30 and coupling device 42 by means of receiving device 32. Furthermore, the test unit has a gas chamber 90 with a formation 94 formed as an opening, whereby gas chamber 90 during the first state is connected gas-tight with surface 62 of integrated circuit 60.

Integrated circuit 60 in the package on top side 62 has an opening 80 and a sensor device (not shown) formed in opening 80. In the present case, the sensor device is configured as a gas sensor. During the first state, formation 94 formed as an opening completely covers opening 80, whereby an elastic sealing lip 92 is formed between gas chamber 90 and surface 62 of integrated circuit 60. Preferably, gas chamber 90 forms a gas-tight connection with opening 80. In the first state, a predetermined gas concentration and/or moisture concentration is established within gas chamber 90 and the electrical parameters of electric circuit 60 and particularly the sensor device are measured as a function of the gas composition within gas chamber 90. Stated differently, the functionality of the entire circuit including the sensor device is determined in this way.

After the functionality of the sensor device and of the integrated circuit is tested in the first state, in a second state the test unit is removed from the handler and the IC is taken out of the socket in the handler. Next, another IC is inserted in the socket with the handler for testing.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A test system comprising:
    a test unit;
    a manipulation device having a receiving unit with a socket fixedly disposed on the receiving unit; and
    a packaged integrated circuit having a top side and bottom side with at least two electrical terminal contacts being formed on the bottom side, the integrated circuit including a sensor device arranged on the top side of the integrated circuit, the top side of the integrated circuit being oriented in a direction of the test unit and the electrical terminal contacts being electrically connected to the socket on the receiving unit of the manipulation device,
    wherein, in a first state, via the receiving unit, the manipulation device provides the integrated circuit to the test unit, and
    wherein, in the first state, the test unit is arranged above the top side of the integrated circuit and forms a connection with the manipulation device via the receiving unit, and the test unit carries out a function test on the integrated circuit.

2. The test system according to claim 1, wherein the receiving unit has a coupling device and wherein the socket is electrically connected to the test unit via the coupling device.

3. The test system according to claim 2, wherein the test unit has a receiving device for the coupling device and wherein the receiving device creates an electrical connection between the test unit and the coupling device.

4. The test system according to claim 1, wherein the integrated circuit has an opening with a sensor device formed in the opening on the top side in the package.

5. The test system according to claim 1, wherein the integrated circuit has an opening with a light sensor formed in the opening on the top side in the package.

6. The test system according to claim 1, wherein the integrated circuit has an opening on the top side in the package.

7. The test system according to claim 6, wherein a gas sensor is formed in the opening.

8. The test system according to claim 6, wherein a moisture sensor is formed in the opening.

9. The test system according to claim 1, wherein the test unit has a gas chamber and wherein the gas chamber during the first state is connected gas-tight with the surface of the integrated circuit.

10. The test system according to claim 9, wherein an elastic sealing lip is formed between the gas chamber and the surface of the integrated circuit.

11. The test system according to claim 9, wherein, in the first state, a predetermined gas concentration and/or moisture concentration is formed within the gas chamber.

12. Use of the test system according to claim 9 for measuring electrical parameters of the electric circuit as a function of at least one or more parameters of the gas composition within the gas chamber.

13. The test system according to claim 1, wherein the receiving unit of the manipulation device includes a bottom section on which the socket is disposed, and a side wall section that extends from the bottom section and that forms the connection to the test unit, and
    wherein the bottom section and the side wall section encloses the integrated circuit in the first state.

14. The test system according to claim 1, wherein the test unit has a gas chamber and during the first state the gas chamber is connected gas-tight with the surface of the integrated circuit so that the opening is completely covered.

15. The test system according to claim 13, wherein the receiving unit includes a coupling device disposed on a top section of the side wall section,
   wherein the test unit has a receiving device on a bottom section of the test unit, and
   wherein the coupling device of the receiving unit is coupled with the receiving device of the test unit so that the socket is electrically connected to the test unit via the coupling device and the receiving device.

16. The test system according to claim 1, wherein the receiving unit transmits signals received from the integrated circuit via the socket to the test unit.

17. The test system according to claim 1, wherein the integrated circuit is placed on the socket on the receiving unit in a placement direction,
   wherein the test unit is configured to be placed over the manipulation unit in the arrangement direction so as to cover the integrated circuit, and
   wherein the integrated circuit is disposed between the test unit and the manipulation unit.

\* \* \* \* \*